(12) United States Patent
Niwa

(10) Patent No.: US 11,211,361 B2
(45) Date of Patent: Dec. 28, 2021

(54) SEMICONDUCTOR DEVICE AND METHOD FOR MANUFACTURING THE SAME

(71) Applicant: KIOXIA CORPORATION, Tokyo (JP)

(72) Inventor: Keiichi Niwa, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 16/807,808

(22) Filed: Mar. 3, 2020

(65) Prior Publication Data
US 2021/0066249 A1 Mar. 4, 2021

(30) Foreign Application Priority Data
Aug. 27, 2019 (JP) .............................. JP2019-154549

(51) Int. Cl.
| H01L 25/065 | (2006.01) |
|---|---|
| H01L 23/31 | (2006.01) |
| H01L 23/00 | (2006.01) |
| H01L 21/56 | (2006.01) |

(52) U.S. Cl.
CPC .......... *H01L 25/0657* (2013.01); *H01L 21/56* (2013.01); *H01L 23/3121* (2013.01); *H01L 24/81* (2013.01); *H01L 2224/81203* (2013.01); *H01L 2225/0651* (2013.01); *H01L 2225/06506* (2013.01); *H01L 2225/06562* (2013.01)

(58) Field of Classification Search
CPC . H01L 25/0657; H01L 23/3121; H01L 24/81; H01L 21/56
See application file for complete search history.

(56) References Cited

U.S. PATENT DOCUMENTS

| 4,942,140 | A | * | 7/1990 | Ootsuki | .................. H01L 21/56 174/535 |
|---|---|---|---|---|---|
| 8,101,461 | B2 | * | 1/2012 | Takano | ............... H01L 23/3128 438/109 |
| 8,586,407 | B2 | * | 11/2013 | Lieu | ..................... H01L 21/6835 438/106 |
| 10,818,630 | B2 | * | 10/2020 | Yoshioka | ............ H01L 23/3107 |
| 10,950,593 | B2 | * | 3/2021 | Chien | .................. H01L 23/5226 |
| 2010/0117244 | A1 | | 5/2010 | Miyagawa et al. | |
| 2012/0068341 | A1 | * | 3/2012 | Lieu | ......................... H01L 21/56 257/738 |
| 2015/0179623 | A1 | | 6/2015 | Ono et al. | |
| 2015/0214207 | A1 | | 7/2015 | Yoshida | |
| 2015/0279811 | A1 | * | 10/2015 | Kim | ....................... H01L 21/561 438/113 |
| 2019/0164909 | A1 | * | 5/2019 | Chien | ................. H01L 23/3157 |
| 2019/0287919 | A1 | * | 9/2019 | Sano | ..................... H01L 23/552 |
| 2019/0287939 | A1 | * | 9/2019 | Takemoto | ............... H01L 25/50 |

FOREIGN PATENT DOCUMENTS

| TW | 201535538 A | 9/2015 |
|---|---|---|
| TW | 201535668 A | 9/2015 |

* cited by examiner

*Primary Examiner* — Nicholas J Tobergte
(74) *Attorney, Agent, or Firm* — Foley & Lardner LLP

(57) ABSTRACT

According to one embodiment, a semiconductor device includes a first substrate. A first semiconductor chip having a first surface facing the first substrate and a second surface opposite the first surface. The first semiconductor chip has electrodes on the first surface and is coupled to the first substrate. A first resin layer is provided at least between the first substrate and the first semiconductor chip, and covers the second surface. The first resin layer has an upper surface substantially flatter than the second surface.

8 Claims, 19 Drawing Sheets

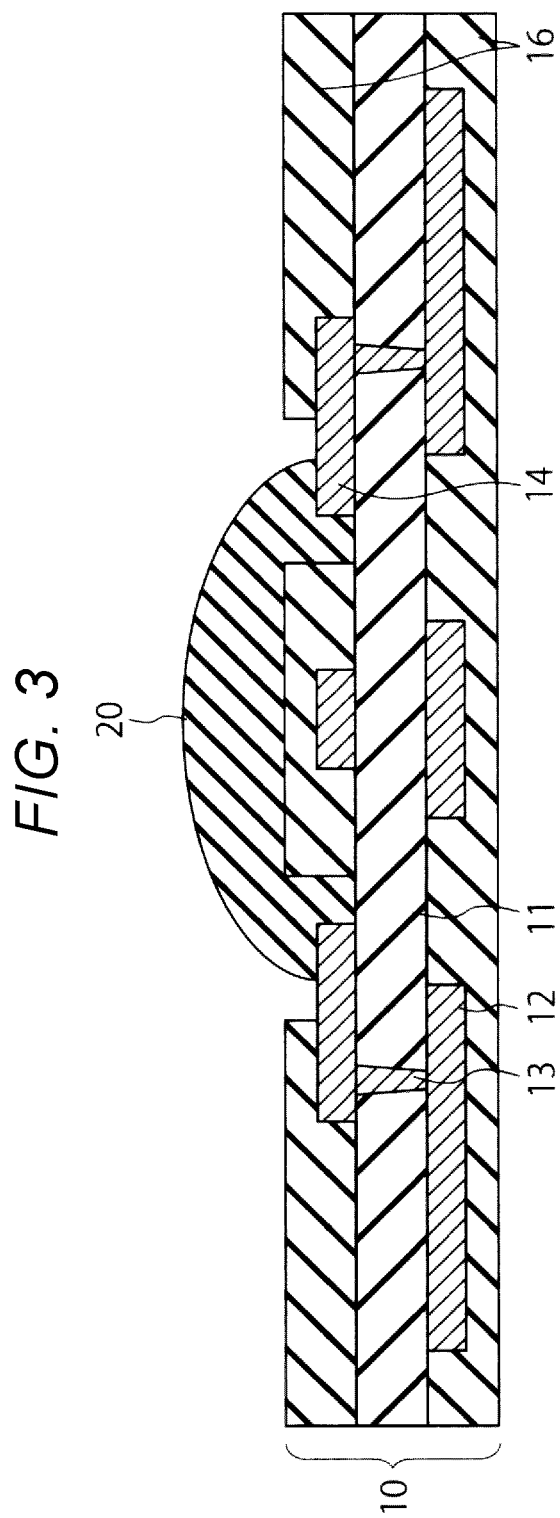

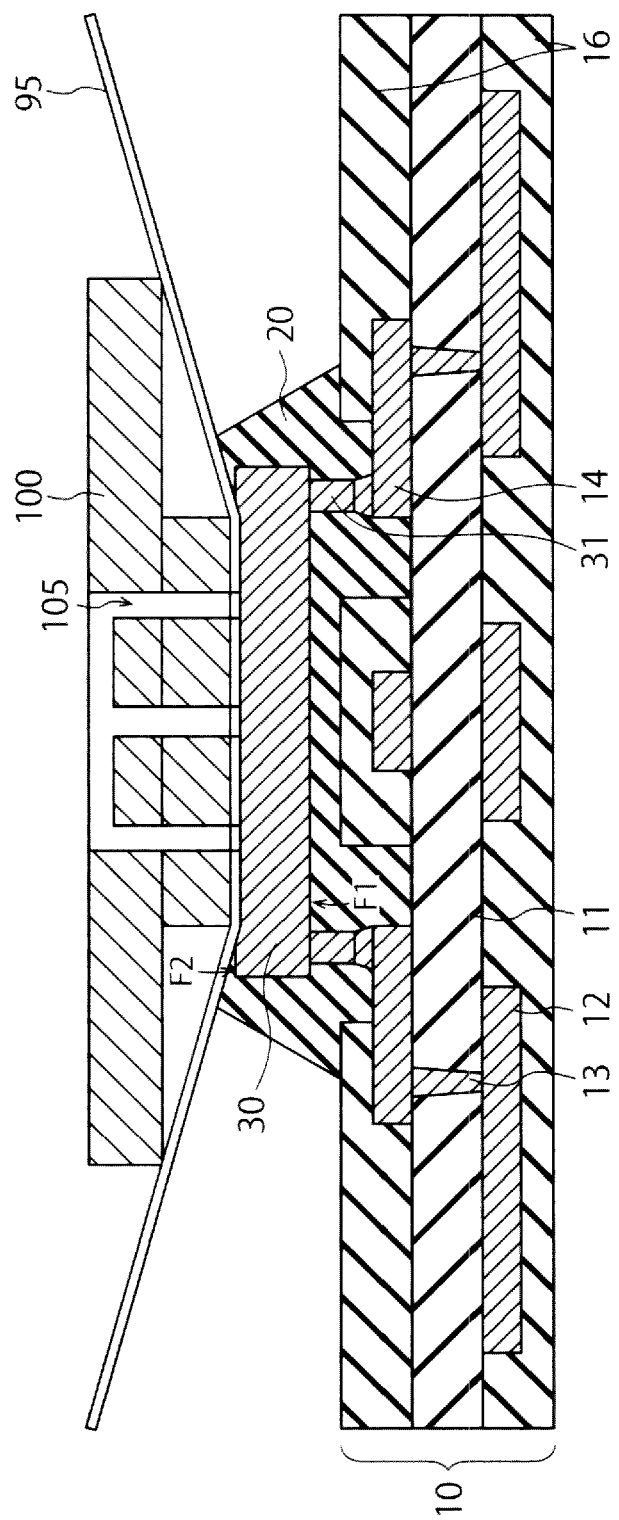

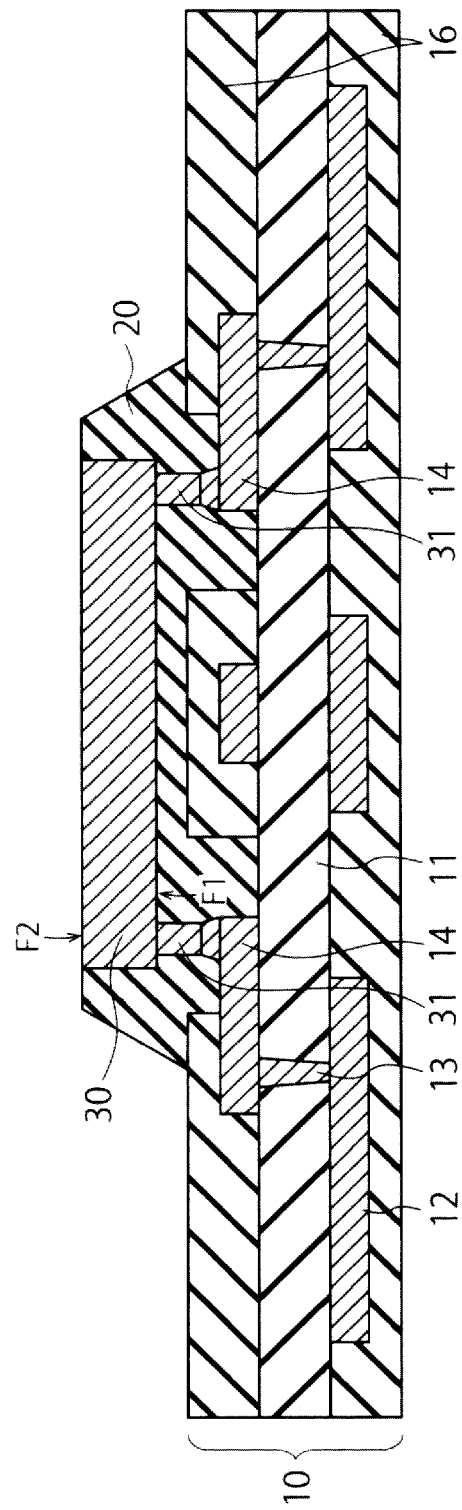

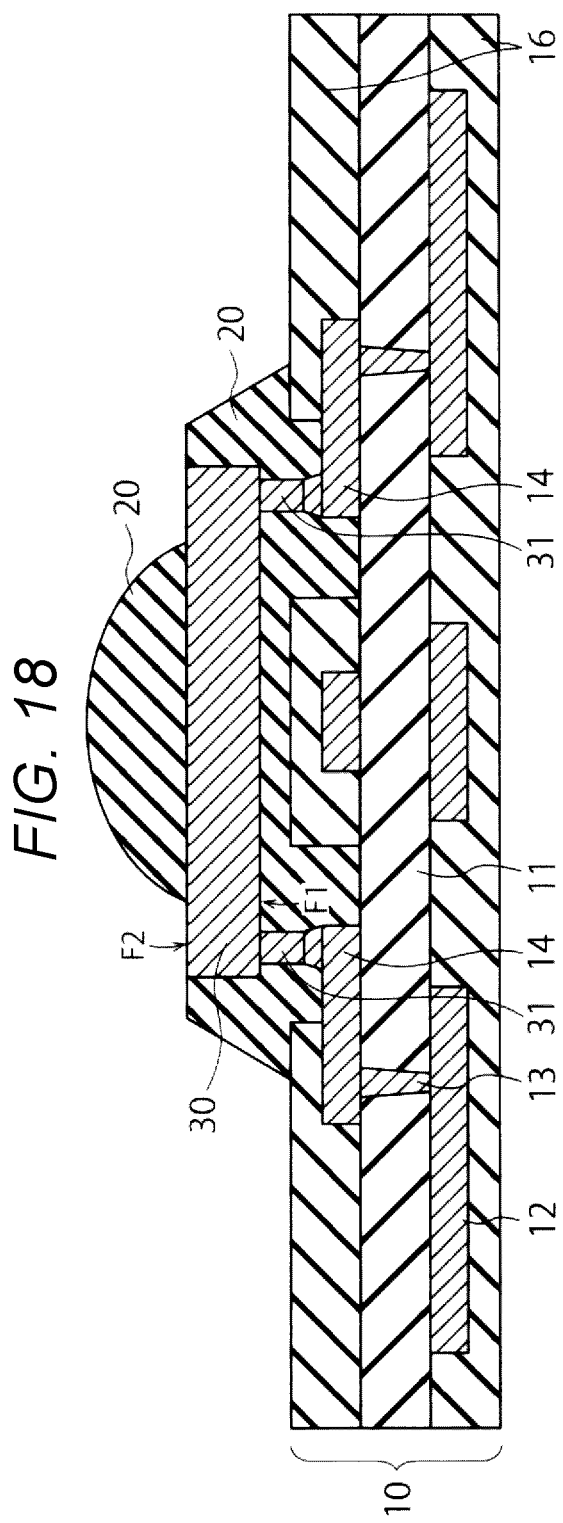

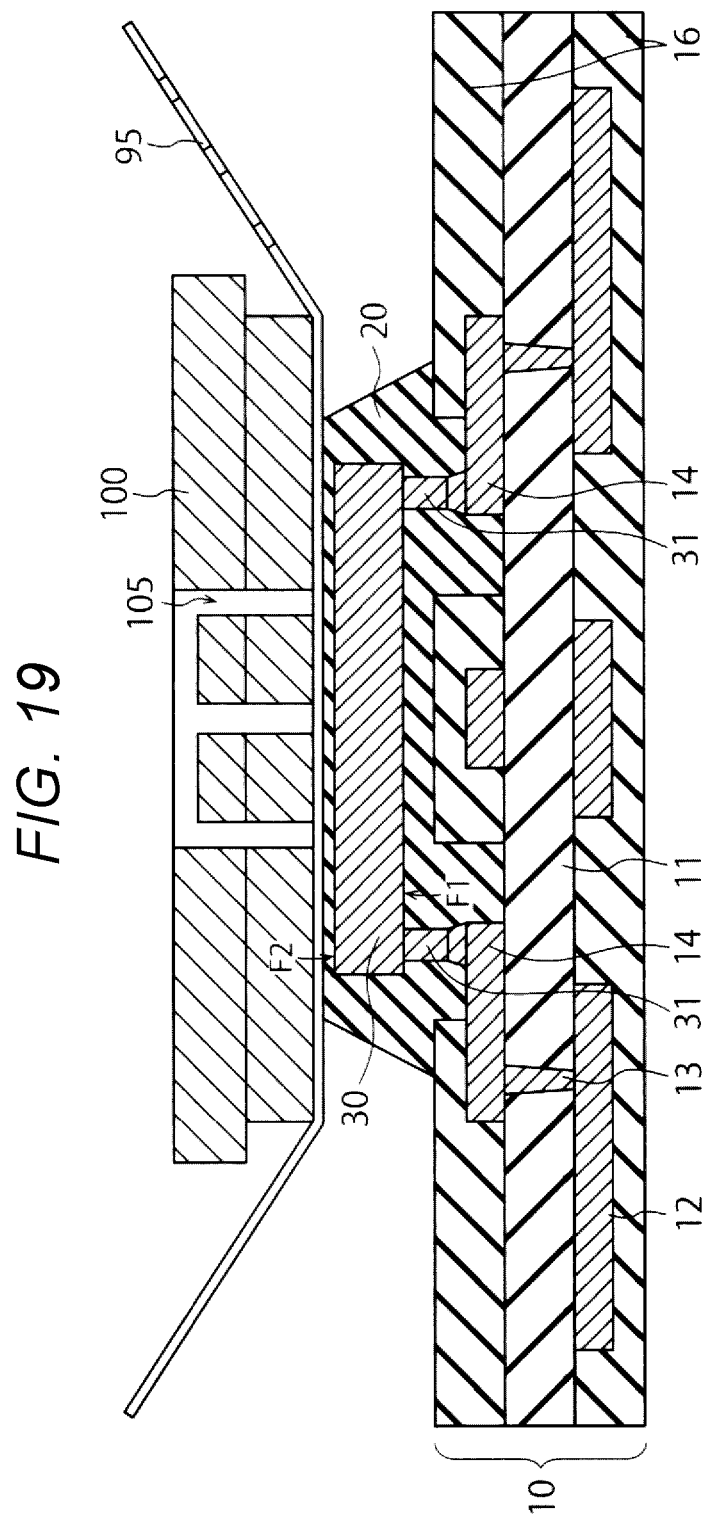

SEMICONDUCTOR DEVICE AND METHOD FOR MANUFACTURING THE SAME

CROSS-REFERENCE TO RELATED APPLICATION(S)

This application is based upon and claims the benefit of priority from Japanese Patent Application No. 2019-154549, filed Aug. 27, 2019, the entire contents of which are incorporated herein by reference.

FIELD

Embodiments described herein relate generally to a semiconductor device and a method for manufacturing the semiconductor device.

BACKGROUND

Some semiconductor chips have metal bumps and are flip-chip connected to terminals on a wiring substrate. The semiconductor chips are thinned and sometimes warp when they are subjected to a semiconductor device production process. When such a warped semiconductor chip is flip-chip connected to a wiring substrate, the semiconductor chip can sometimes be chipped or cracked. Further, when a semiconductor chip is stacked on a warped semiconductor chip, adhesion between the stacked semiconductor chips may be poor, resulting in peeling of an adhesive between the semiconductor chips.

Examples of related art include U.S. Pat. No. 4,942,140 and US Patent Publications Nos. 2010/117244 and 2015/214207.

DESCRIPTION OF THE DRAWINGS

FIG. 3 is a cross-sectional view illustrating a step, following the step of FIG. 2C, of the semiconductor device manufacturing process;

FIG. 4 is a cross-sectional view illustrating a step, following the step of FIG. 3, of the semiconductor device manufacturing process;

FIG. 17 is a cross-sectional view illustrating a step, following the step of FIG. 16, of the semiconductor device manufacturing process;

FIG. 18 is a cross-sectional view illustrating a step, following the step of FIG. 17, of the semiconductor device manufacturing process; and FIG. 19 is a cross-sectional view illustrating a step, following the step of FIG. 18, of the semiconductor device manufacturing process.

DETAILED DESCRIPTION

Figure 1:
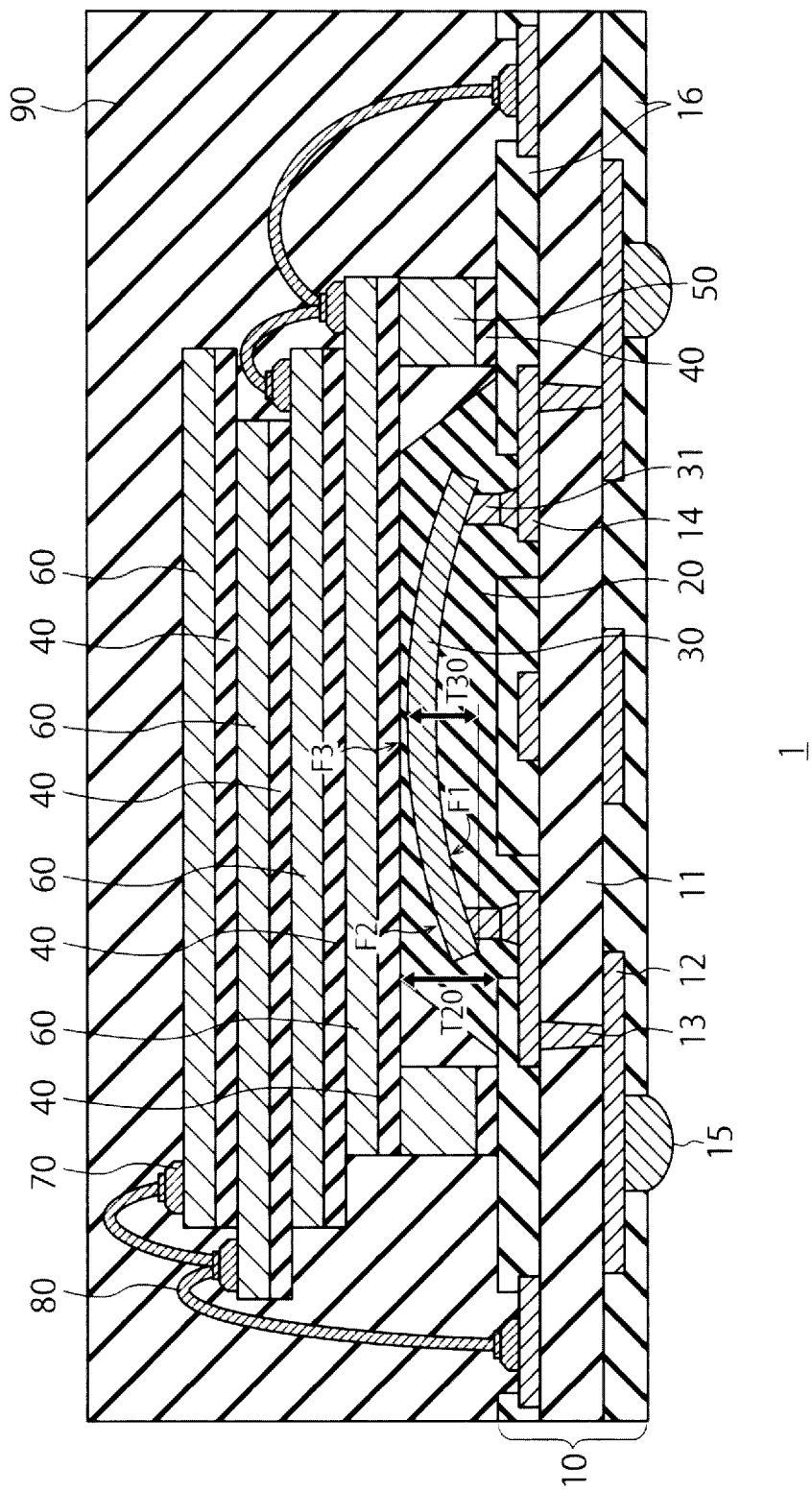
FIG. 1 is a cross-sectional view showing a structure of a semiconductor device according to a first embodiment.

Embodiments provide a semiconductor device which, when a warped semiconductor chip is mounted on a wiring substrate, can prevent cracking of the semiconductor chip, and in which a semiconductor chip can be stacked on the warped semiconductor chip with good adhesion.

In general, according to one embodiment, a semiconductor device includes a first substrate. A first semiconductor chip having a first surface facing the first substrate and a second surface opposite the first surface. The first semiconductor chip has electrodes on the first surface and is coupled to the first substrate. A first resin layer is provided at least between the first substrate and the first semiconductor chip, and covers the second surface. The first resin layer has an upper surface substantially flatter than the second surface.

Embodiments of the present disclosure will now be described with reference to the drawings. The embodiments do not limit the scope of the present disclosure. The drawings are schematic or conceptual; thus, the size ratio between components or elements, etc. are not necessarily to scale. In the drawings and in the following description, the same symbols are used for the same or similar components or elements, and a detailed description thereof will sometimes be omitted.

First Embodiment

FIG. 1 is a cross-sectional view showing a structure of a semiconductor device according to a first embodiment. The semiconductor device 1 according to this embodiment is, for example, a NAND flash memory. The semiconductor device 1 includes a wiring substrate 10, a resin layer 20, a controller chip 30, an adhesive layer(s) 40, a spacer 50, a NAND memory chip(s) (hereinafter referred to as a memory chip) 60, metal pads 70, bonding wires 80, and an encapsulating resin 90. This embodiment is not limited to a NAND flash memory; it is applicable to a semiconductor device which is to be flip-chip connected.

The wiring substrate 10 as a first substrate includes an insulating substrate 11, interconnects 12, contact plugs 13, metal pads 14, metal bumps 15, and solder resists 16. An insulating material such as a glass-epoxy resin is used for the insulating substrate 11. The interconnects 12 are provided on the front or back surface or in the interior of the insulating substrate 11, and electrically connect the metal pads 14 and the metal bumps 15. The contact plugs 13 penetrate the insulating substrate 11 and electrically connect the interconnects 12. Each metal pad 14 is connected to an electrode 31 of the controller chip 30 in the front surface of the wiring substrate 10. The metal bumps 15 are connected to the interconnects 12 in the back surface of the wiring substrate 10. A conductive material such as copper is used for the interconnects 12, the contact plugs 13 and the metal pads 14. A conductive material such as nickel or solder is used for the metal bumps 15.

The controller chip 30 as a first semiconductor chip has a first surface F1 that faces the wiring substrate 10, and a second surface F2 opposite to the first surface F1. Metal bumps 31 as electrodes are provided on the first surface F1. The metal bumps 31 are connected to the metal pads 14 of the wiring substrate 10. In some embodiments, the controller chip 30 may be referred to as a flip-chip connected to the wiring substrate 10.

The controller chip 30 has been thinned, and has a semiconductor device on the first surface F1 or the second surface F2. The controller chip 30 sometimes warps during the formation of the semiconductor device. The warpage of the controller chip 30 may be, for example, arc-shaped, bowl-shaped or saddle-shaped. In FIG. 1, the controller chip 30 is arc-shaped.

The resin layer (first resin layer) 20 is filled between the wiring substrate 10 and the controller chip 30, and covers and protects the connecting portions between the metal pads 14 and the electrodes 31. The resin layer 20 is also provided on the second surface F2 of the controller chip 30, and covers the entire second surface F2. The resin layer 20 is made of a non-conductive resin material which may be an NCP (Non-Conductive Paste) such as a paste comprising a mixture of an epoxy resin, an acrylic resin, silica, etc. The resin layer 20 covers the entire controller chip 30, and has a substantially flat upper surface F3. The upper surface F3 of the resin layer 20 is located higher than at least the second surface F2 of the controller chip 30 and is flatter than (e.g., having less warpage) the second surface F2.

The spacer 50 is provided around the controller chip 30, and bonded to the wiring substrate 10 with an adhesive layer (DAF (Die Attachment Film)) 40. The top of the spacer 50 is located on approximately the same level as the upper surface F3 of the resin layer 20. The spacer 50 supports the memory chip 60. The spacer 50 has, for example, a quadrangular frame-like shape and is provided on the front surface of the wiring substrate 10 such that it surrounds the entire circumference of the controller chip 30. Silicon, for example, may be used as a material for the spacer 50.

The memory chip 60 is provided above the controller chip 30, and bonded to the resin layer 20 and the spacer 50 via the adhesive layer 40. The memory chip 60 includes, for example, a three-dimensional memory cell array in which a plurality of memory cells are three-dimensionally arranged. The adhesive layer 40 is provided on the resin layer 20 and the spacer 50, and bonds the memory chip 60 to the resin layer 20 and the spacer 50.

Though the controller chip 30 is warped, the resin layer 20 is provided on the entire second surface F2 of the controller chip 30. The upper surface F3 of the resin layer 20 is substantially flat. The memory chip 60 can be disposed on the substantially flat upper surface F3 of the resin layer 20 without being influenced by the warpage of the controller chip 30. It therefore becomes possible to prevent chipping or cracking of the memory chip 60.

A plurality of adhesive layers 40 and a plurality of memory chips 60 may be alternately stacked on the resin layer 20 and the spacer 50. Also in this case, owing to the substantially flat upper surface F3 of the resin layer 20, the memory chips 60 are unlikely to be influenced by the warpage of the controller chip 30. Thus, the memory chips 60 are unlikely to be chipped or cracked, and are unlikely to peel off the adhesive layers 40.

Each bonding wire 80 electrically connects the metal pad 70 of the memory chip 60 and one of the metal pads 14 of the wiring substrate 10. The encapsulating resin 90 as a second resin layer covers and protects the entire structure, including the controller chip 30, the memory chip (s) 60, the bonding wires 80, etc., on the wiring substrate 10.

As described above, according to this embodiment, the resin layer 20 covers the entire second surface F2 of the controller chip 30 and provides the substantially flat upper surface F3 lying over the second surface F2 of the controller chip 30. Even when the controller chip 30 is warped, the substantially flat upper surface F3 of the resin layer 20 can cancel the warpage of the controller chip 30. To this end, the thickness T20 of the resin layer 20 is preferably not less than (e.g., greater than or equal to) the amount of warpage (the distance between the upper end and the lower end of the controller chip 30) T30 of the controller chip 30. Thus, the resin layer 20 can be provided at least in an area ranging from the front surface of the wiring substrate 10 to the upper end of the controller chip 30, making it possible to cover the entire second surface F2 substantially flatly. Owing to the substantially flat upper surface F3 of the resin layer 20, the memory chip(s) 60 is unlikely to be influenced by the warpage of the controller chip 30. Thus, if a plurality of memory chips 60 are stacked over the controller chip 30, chipping or poor adhesion of the memory chips 60 can be prevented.

Referring to FIG. 1, the controller chip 30 which is flip-chip connected to the wiring substrate 13 and the memory chips 60 which are electrically connected by wire bonding to the wiring substrate 13 are both provided in the same single semiconductor package. Thus, the semiconductor device of FIG. 1 is a hybrid multi-chip package. However, in this embodiment the memory chips 60 may also be flip-chip connected to the wiring substrate 13.

A method for manufacturing the semiconductor device 1 according to this embodiment will now be described.

Figure 2A:
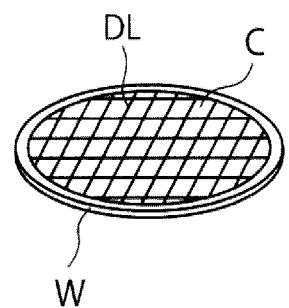
FIGS. 2A through 2C are perspective views illustrating steps of a semiconductor device manufacturing process according to a first embodiment.

FIGS. 2A through 8 are perspective views or cross-sectional views illustrating a semiconductor device manufacturing process according to this embodiment. FIGS. 2A through 2C illustrate process steps from a semiconductor wafer process to a dicing step. The semiconductor wafer process can be applied to both the controller chip 30 and the memory chip 60. The controller chip 30 or the memory chip 60 may be hereinafter referred to also as the semiconductor chip C.

At the outset, not-shown semiconductor devices are formed in the surface of a semiconductor wafer W. The semiconductor devices may be, for example, memory cell arrays or CMOS (Complementary Metal Oxide Semiconductor) circuits. Next, the back surface of the semiconductor wafer W is polished e.g. by CMP (Chemical Mechanical Polishing). Next, TSVs (Through Silicon Vias), electrode pads, metal bumps, etc. (all not shown) are formed in the semiconductor wafer W.

FIG. 2A shows the semiconductor wafer W after the formation of the semiconductor devices. The semiconductor wafer W has dicing lines DL between semiconductor chips C. The semiconductor wafer W is diced along the dicing lines DL into the individual semiconductor chips C as will be described later.

Figure 2B:
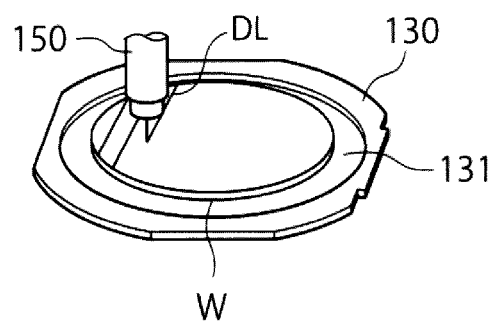

Next, as shown in FIG. 2B, the semiconductor wafer W is attached to a flexible resin tape 131 which is stretched in a wafer ring 130. Laser light is then emitted by a laser oscillator 150 toward those portions of the surface of the semiconductor wafer W which correspond to the dicing lines DL, thereby forming grooves along the dicing lines DL of the semiconductor wafer W.

Figure 2C:
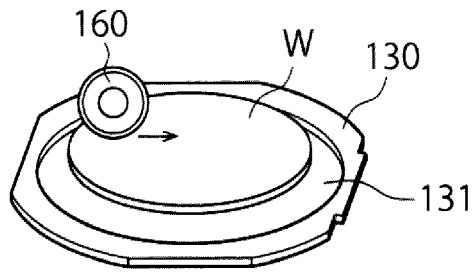

Next, as shown in FIG. 2C, using a dicing blade 160, the semiconductor wafer W is diced along the dicing lines DL into the individual semiconductor chips C on the resin tape 131.

Next, the resin tape 131 is irradiated with ultraviolet light to reduce the adhesion of an adhesive between the semiconductor chips C and the resin tape 131 so that the semiconductor chips C can be removed from the resin tape 131. Further, the semiconductor chips C are subjected to an appearance check, etc.

FIGS. 3 though 8 illustrate an assembly process for mounting a semiconductor chip C (controller chip 30 or memory chip 60) on the wiring substrate 10. In FIG. 4 and the subsequent figures, depiction of warpage of the controller chip 30 is omitted.

As shown in FIG. 3, a material for the resin layer 20 is supplied onto the front surface of the wiring substrate 10. The material for the resin layer 20 is liquid at this stage, and supplied to an area in which the controller chip 30 is to be disposed.

Next, as shown in FIG. 4, a pressure bonding apparatus 100 attracts and holds the controller chip 30 via an FAB (Film Assist Bonding) film 95, and places the controller chip 30 on the wiring substrate 10. The pressure bonding apparatus 100 stacks the controller chip 30 on the wiring substrate 10 in such a manner that the electrodes 31, provided on the first surface F1 of the controller chip 30, meet the metal pads 14 of the wiring substrate 10.

The pressure bonding apparatus 100 has suction holes 105 connected to a not-shown vacuum pump, and attracts and holds the controller chip 30 through the suction holes 105. The attracting surface of the pressure bonding apparatus 100 is substantially flat in order to press the controller chip 30 against the wiring substrate 10 and to make the upper surface F3 of the resin layer 20 substantially flat. The FAB film 95 as a resin film intervenes between the pressure bonding apparatus 100 and the controller chip 30 so that the material for the resin layer 20 will not adhere to the pressure bonding apparatus 100. The FAB film 95 has holes, formed at positions corresponding to the suction holes 105, so that it does not impede the attraction of the controller chip 30 to the pressure bonding apparatus 100.

After stacking the controller chip 30 on the wiring substrate 10, the pressure bonding apparatus 100 heats the wiring substrate 10 and the controller chip 30 while applying a pressure to them, thereby connecting (welding) the electrodes 31 of the controller chip 30 to the metal pads 14 of the wiring substrate 10. When the controller chip 30 is stacked on the wiring substrate 10, the material for the resin layer 20 spreads out of the controller chip 30 on both sides of the pressure bonding apparatus 100 and the controller chip 30, and moves up along the side surfaces of the controller chip 30 and moves inward some distance on the second surface F2. The amount of the material for the resin layer 20 is adjusted upon the supply of the material so that the material will spread onto the second surface F2 to such an extent.

Figure 5:
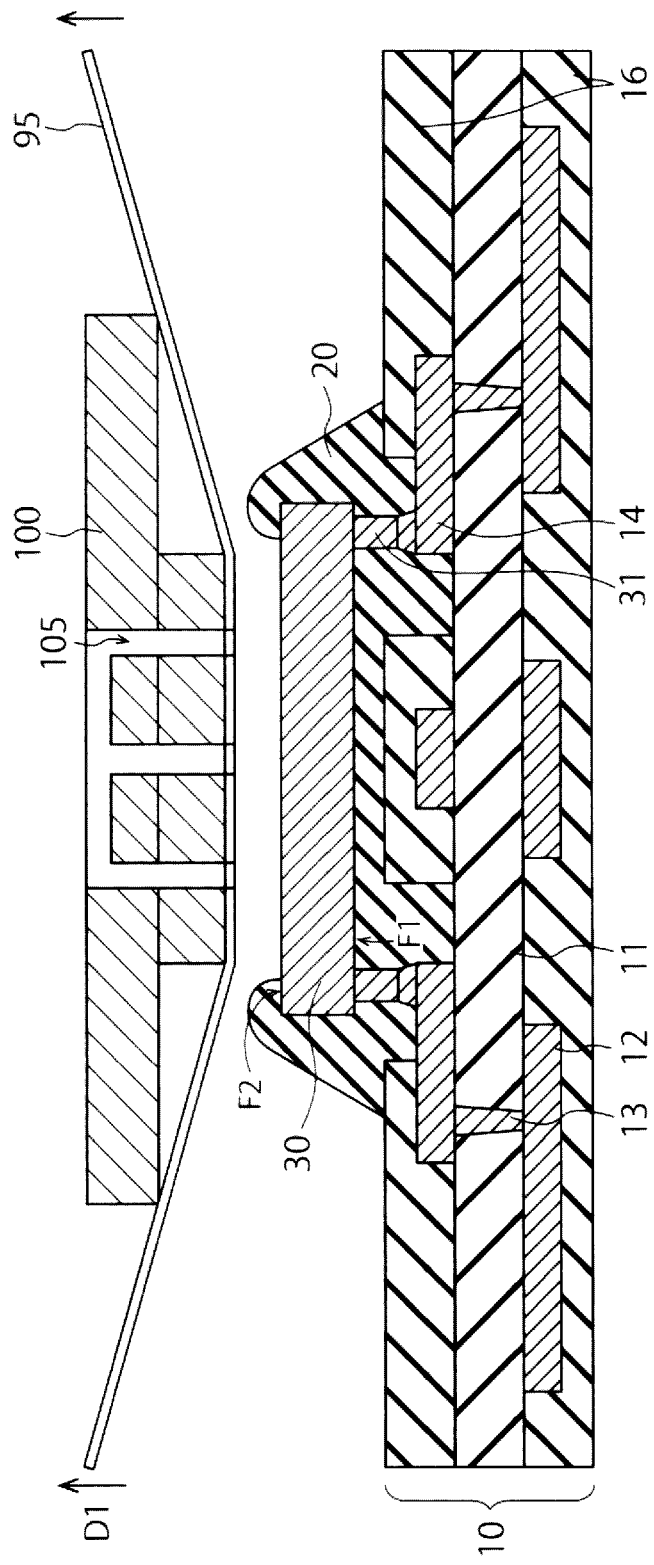
FIG. 5 is a cross-sectional view illustrating a step, following the step of FIG. 4, of the semiconductor device manufacturing process.

Next, as shown in FIG. 5, vacuuming of the pressure bonding apparatus 100 is stopped, and the pressure bonding apparatus 100 is raised a little in the D1 direction. Since the vacuuming has been stopped, the controller chip 30 separates from the pressure bonding apparatus 100 and remains on the wiring substrate 10. The D1 direction is the vertically upward direction and corresponds to the direction in which the controller chip 30 and the memory chip (s) 60 are stacked.

Figure 6:
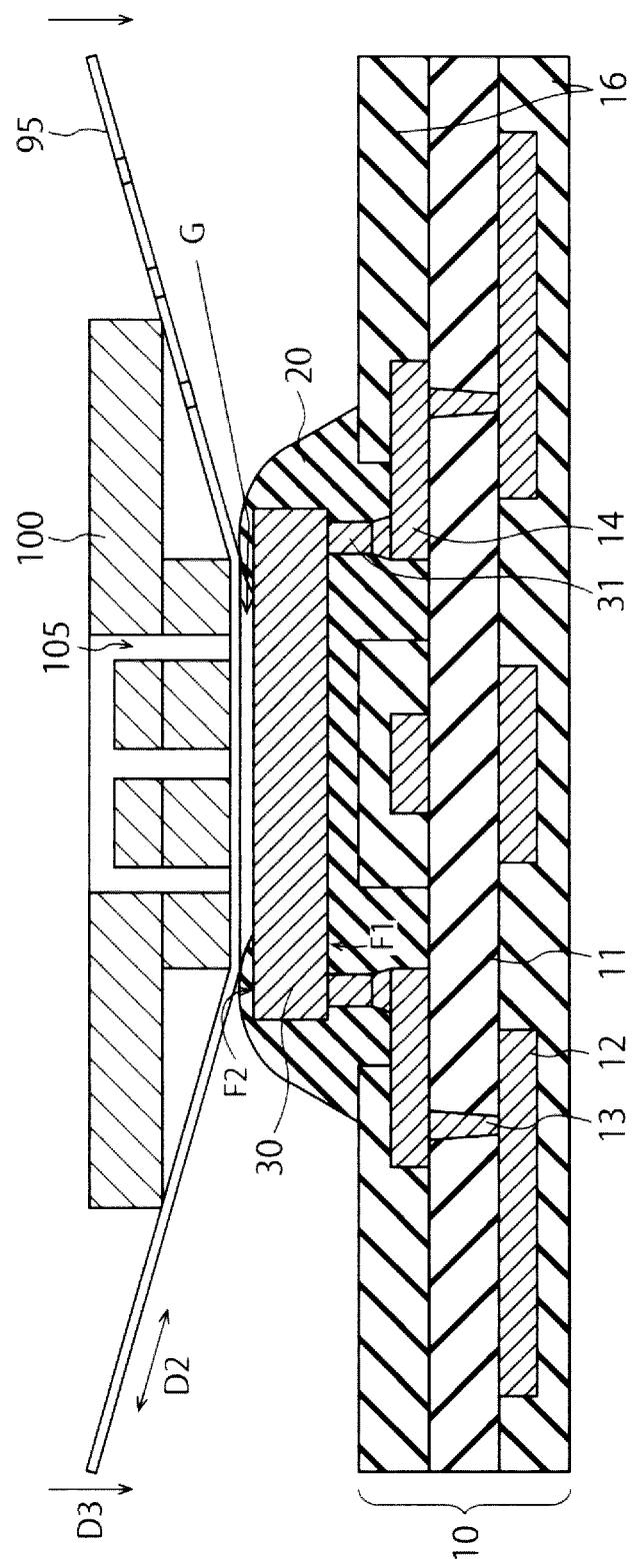
FIG. 6 is a cross-sectional view illustrating a step, following the step of FIG. 5, of the semiconductor device manufacturing process.

Next, as shown in FIG. 6, the FAB film 95 is moved in the D2 direction to displace the holes of the FAB film 95 from the positions corresponding to the suction holes 105 of the pressure bonding apparatus 100. It is preferred that the holes of the FAB film 95 be moved to positions not facing the attracting surface of the pressure bonding apparatus 100. Since the pressure bonding apparatus 100 is not performing vacuuming at this moment, the FAB film 95 can be easily moved with respect to the pressure bonding apparatus 100. This operation can prevent the material for the resin layer 20 from moving through the holes of the FAB film 95 and attaching to the pressure bonding apparatus 100.

Next, the pressure bonding apparatus 100 is lowered a little in the D3 direction. The D3 direction is the vertically downward direction and corresponds to the stacking direction. The pressure bonding apparatus 100 is lowered to such an extent as to form a gap G between the FAB film 95 at the bottom of the pressure bonding apparatus 100 and the second surface F2 of the controller chip 30. In the next step, the material for the resin layer 20 is introduced into the gap G, whereby the surface of the FAB film 95, which faces the controller chip 30, comes to face the upper surface F3 of the resin layer 20. Thus, the bottom surface of the pressure bonding apparatus 100 is set to a position which is higher by the thickness of the FAB film 95 than the upper surface F3 of the resin layer 20.

Figure 7:
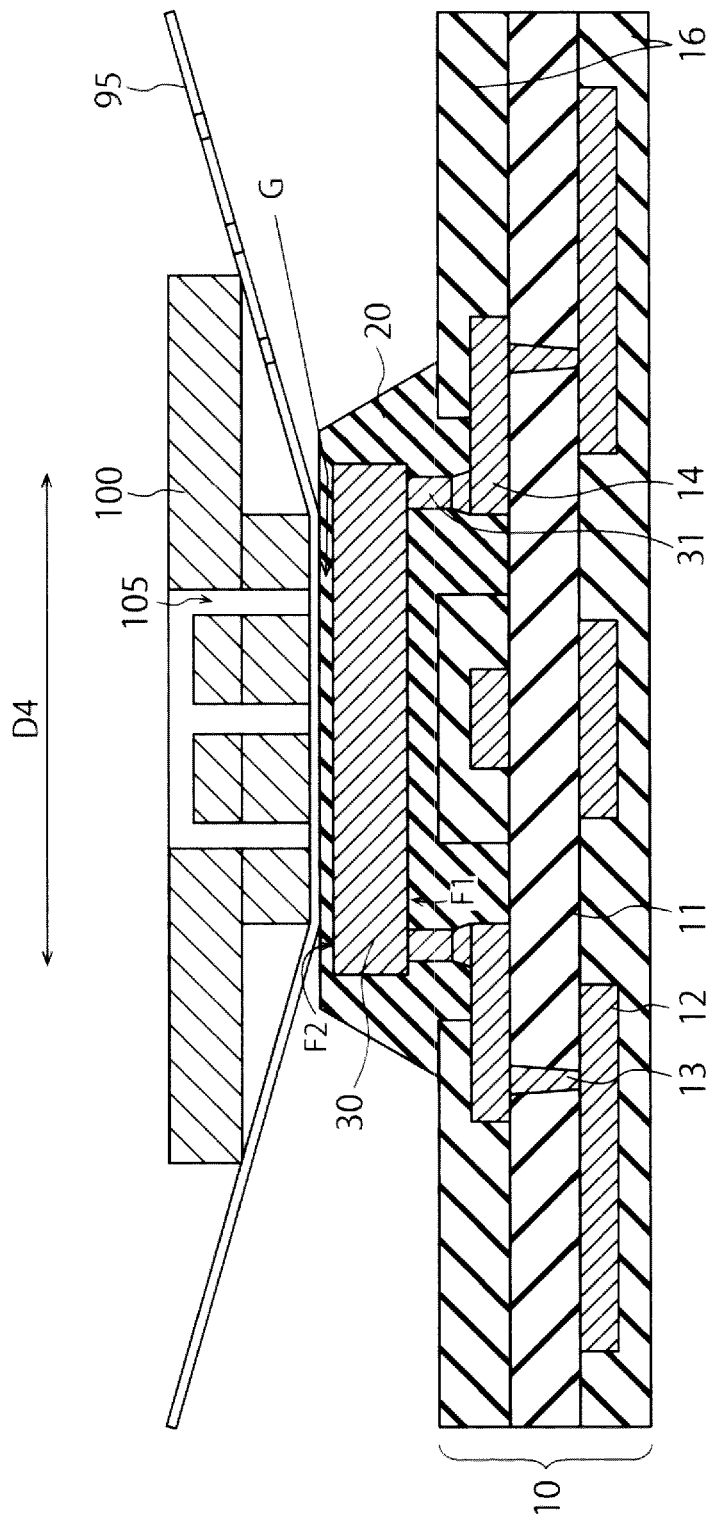
FIG. 7 is a cross-sectional view illustrating a step, following the step of FIG. 6, of the semiconductor device manufacturing process.

Next, as shown in FIG. 7, the pressure bonding apparatus 100 is reciprocated in the D4 direction. The D4 direction is a substantially horizontal direction which is substantially perpendicular to the D1 direction and the D3 direction. During this operation, the FAB film 95 remains stationary, while the pressure bonding apparatus 100 moves relative to the FAB film 95. In this manner, the FAB film 95 is placed on the resin layer 20, and the pressure bonding apparatus 100 planarizes the upper surface of the resin layer 20 with the FAB film 95. The material for the resin layer 20 spreads in the gap G and is substantially flattened between the FAB film 95 and the controller chip 30. As a result, the controller chip 30 is embedded in the resin layer 20; the material for the resin layer 20 covers the entire second surface F2. Further, the upper surface F3 of the resin layer 20 is leveled into a substantially flat surface. Thus, when the area of the bottom surface (attracting surface) of the pressure bonding apparatus 100 is smaller than the area of the second surface F2 of the controller chip 30 as in this embodiment, the resin layer 20 is substantially flattened by reciprocating the pressure bonding apparatus 100 substantially horizontally. Next, the resin layer 20 is cured e.g. by heating the material for the resin layer 20.

Figure 8:
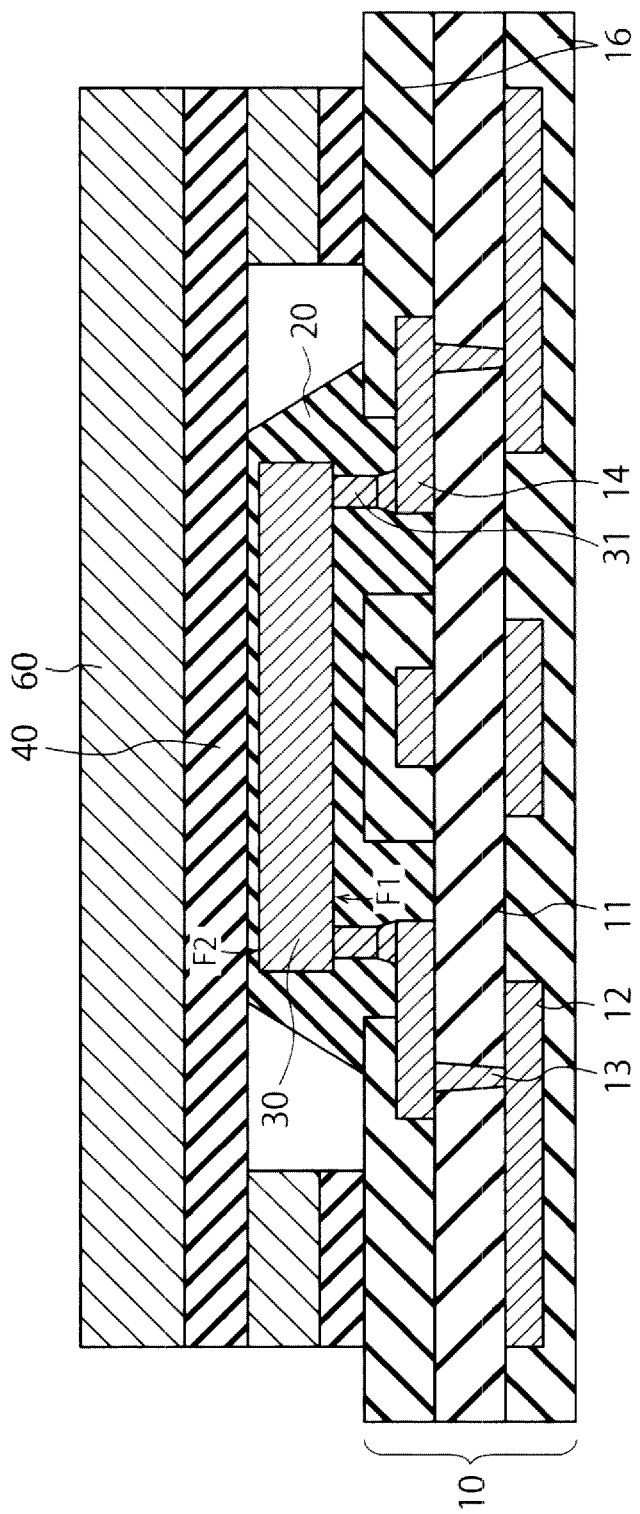
FIG. 8 is a cross-sectional view illustrating a step, following the step of FIG. 7, of the semiconductor device manufacturing process.

Next, as shown in FIG. 8, a spacer 50 is bonded to the wiring substrate 10 with an adhesive layer 40 such that the spacer 50 surrounds the controller chip 30. Further, an adhesive layer 40 is formed on the spacer 50 and the resin layer 20, and a memory chip 60 is placed on the adhesive layer 40. The memory chip 60 is thus bonded to the resin layer 20 and the spacer 50 and disposed above the controller chip 30.

Thereafter, an additional adhesive layer(s) 40 and an additional memory chip(s) 60 may be stacked. After performing wire bonding, the memory chip(s) 60 and the controller chip 30 are encapsulated with an encapsulating resin 90, thereby completing the semiconductor device 1 shown in FIG. 1. Instead of wire bonding, the memory chips 60 may be flip-chip connected by means of not-shown metal bumps.

As described hereinabove, according to this embodiment, the pressure bonding apparatus 100 stacks the controller chip 30 on the wiring substrate 10 and flip-chip connects the controller chip 30 to the wiring substrate 10, and subsequently forms the gap G between the FAB film 95 and the controller chip 30, and introduces the material for the resin layer 20 into the gap G. The pressure bonding apparatus 100 substantially flattens the resin layer 20 from above the FAB film 95, and covers the entire second surface F2 of the controller chip 30 with the resin layer 20. Even when the controller chip 30 is warped, the resin layer 20 can cover the second surface F2 substantially flatly; thus, the resin layer 20 can cancel the warpage of the controller chip 30. Accordingly, even though the memory chip(s) 60 is stacked over the controller chip 30, chipping or poor adhesion of the memory chip(s) 60 can be prevented. In the first embodiment, the material for the resin layer 20 is supplied only once. However, the material may be supplied twice separately as in the below-described third and fourth embodiments.

Second Embodiment

Figure 9:
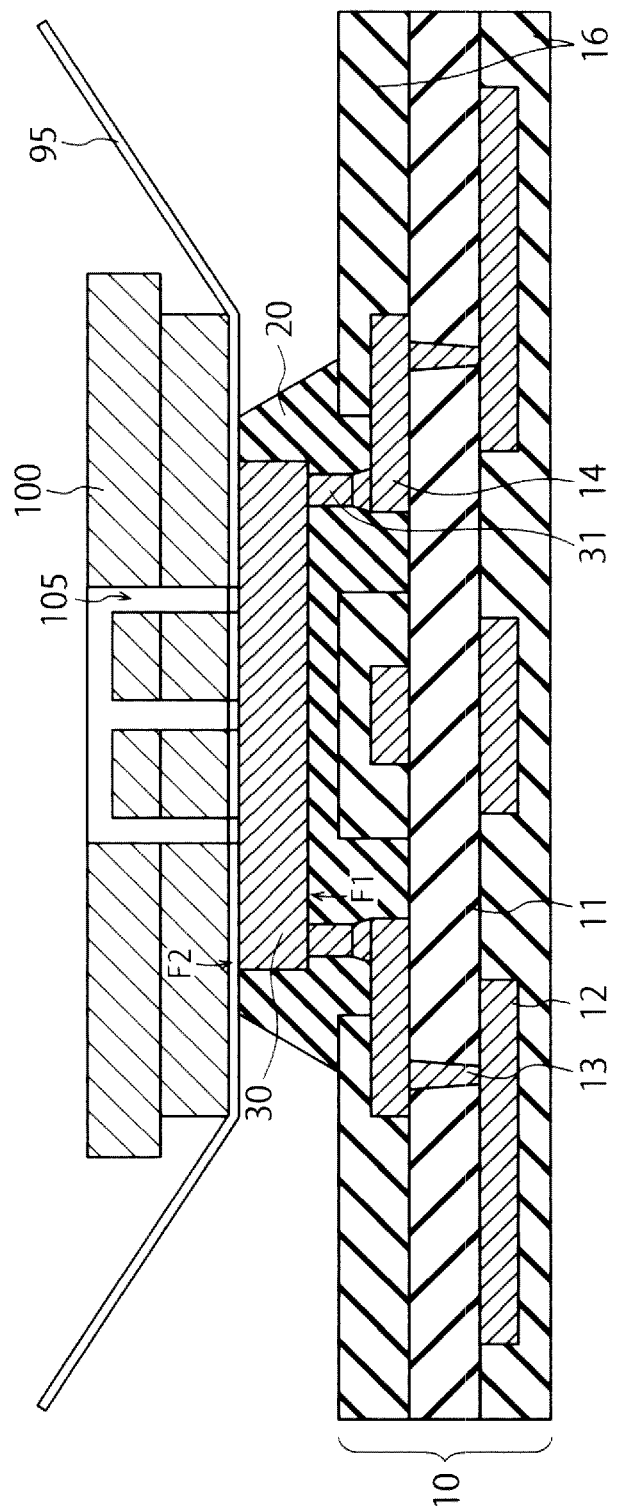
FIG. 9 is a cross-sectional view illustrating a step of a semiconductor device manufacturing process according to a second embodiment.
Figure 10:
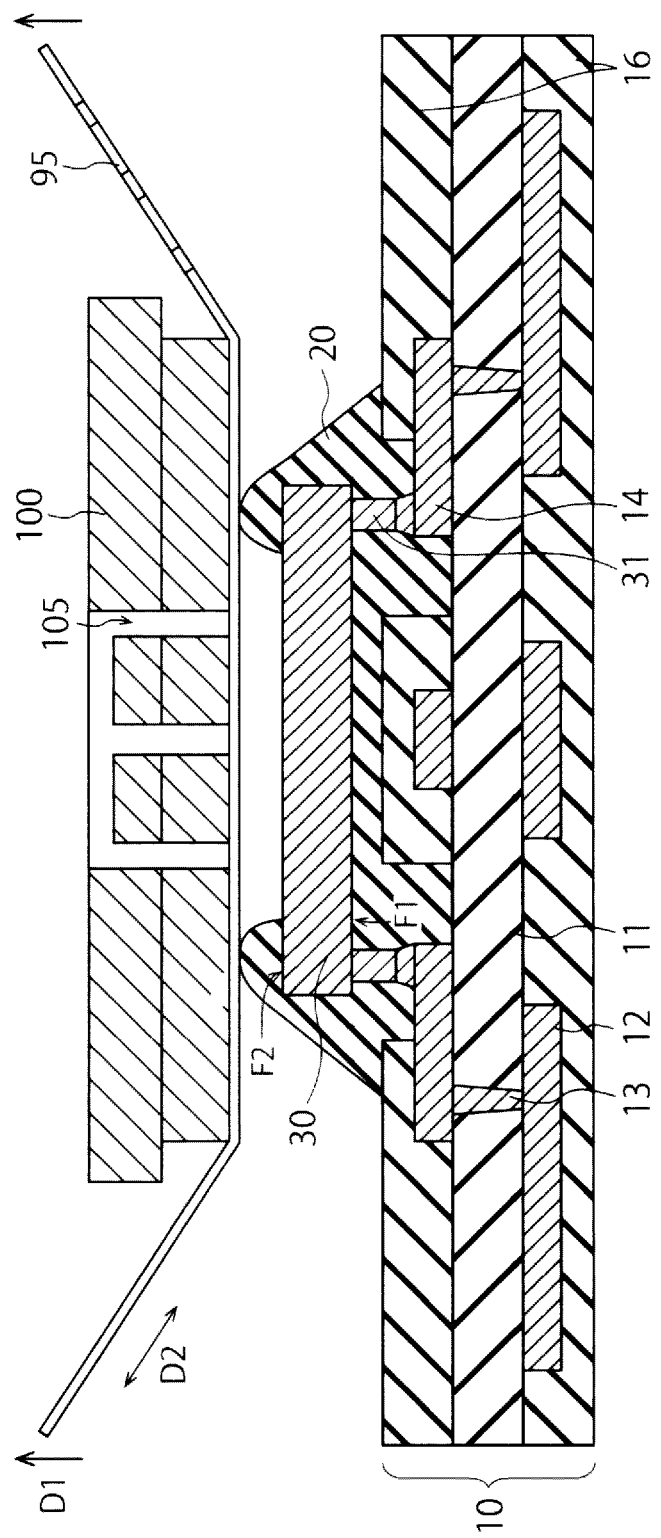
FIG. 10 is a cross-sectional view illustrating a step, following the step of FIG. 9, of the semiconductor device manufacturing process.
Figure 11:
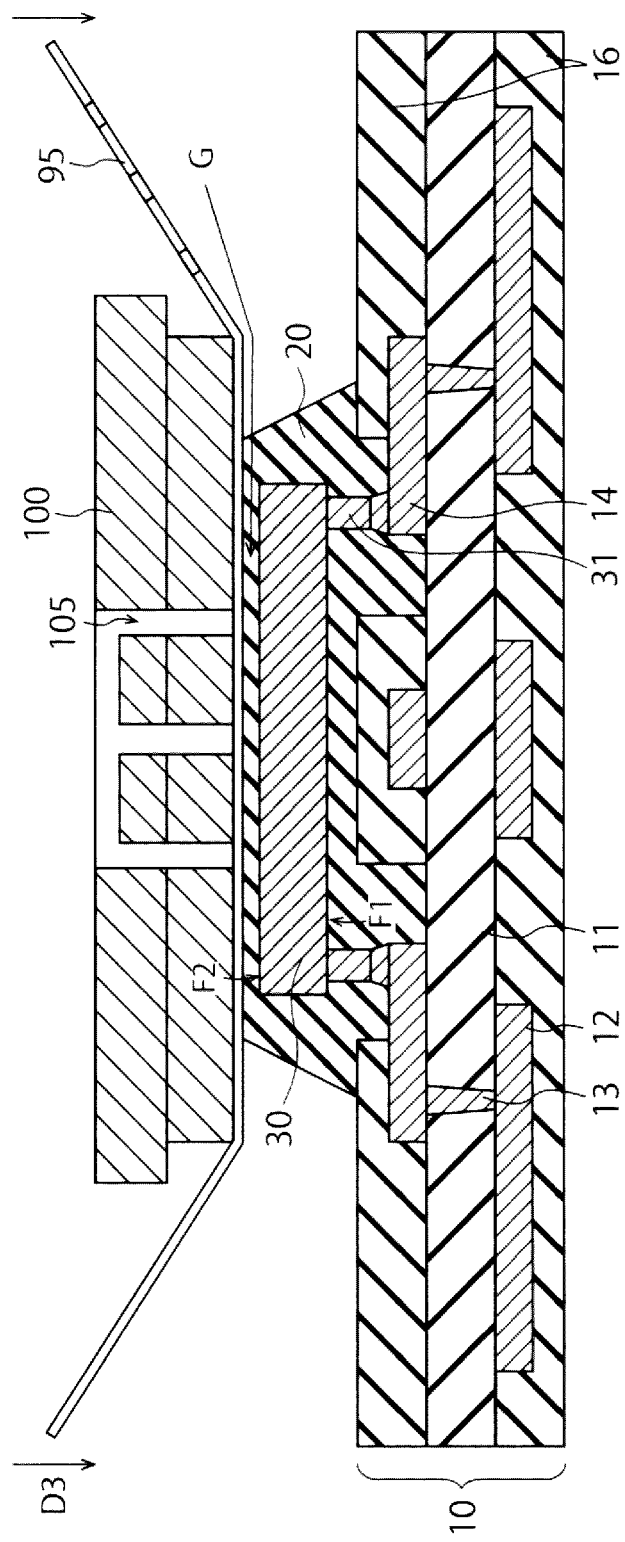
FIG. 11 is a cross-sectional view illustrating a step, following the step of FIG. 10, of the semiconductor device manufacturing process.

FIGS. 9 through 11 are cross-sectional views illustrating a method for manufacturing the semiconductor device 1 according to a second embodiment. In the second embodiment, the area of the attracting surface of the pressure bonding apparatus 100 is larger than the area of the second surface F2 of the controller chip 30. Therefore, the material for the resin layer 20 can be substantially flattened without moving the pressure bonding apparatus 100 in the D4 direction.

For example, after supplying the material for the resin layer 20 onto the wiring substrate 10 as shown in FIG. 3, the pressure bonding apparatus 100 attracts and holds the controller chip 30 via the FAB film 95, and places the controller chip 30 on the wiring substrate 10 as shown in FIG. 9. The pressure bonding apparatus 100 heats the wiring substrate 10 and the controller chip 30 while applying a pressure to them, thereby flip-chip connecting the electrodes 31 of the controller chip 30 to the metal pads 14 of the wiring substrate 10.

Next, as shown in FIG. 10, vacuuming of the pressure bonding apparatus 100 is stopped, and the pressure bonding apparatus 100 is raised a little in the D1 direction. Next, the FAB film 95 is moved in the D2 direction to displace the holes of the FAB film 95 from the positions corresponding to the suction holes 105 of the pressure bonding apparatus 100 in such a way that the material for the resin layer 20 is not adhered to the pressure bonding apparatus 100.

Next, as shown in FIG. 11, the pressure bonding apparatus 100 is lowered a little in the D3 direction, when the material for the resin layer 20 is introduced into the gap G by capillary action. The material for the resin layer 20 comes to cover the entire second surface F2 of the controller chip 30, and the upper surface F3 of the resin layer 20 becomes substantially flattened. The resin layer 20 is then cured e.g. by heating the material for the resin layer 20.

Next, the subsequent process steps described above with reference to the first embodiment are followed to complete the semiconductor device 1 shown in FIG. 1. Thus, the semiconductor device 1 can also be manufactured by using the pressure bonding apparatus 100 having the wide attracting surface. In this embodiment, there is no need to reciprocate the pressure bonding apparatus 100 in the D4 direction.

Third Embodiment

FIGS. 12 through 15 are cross-sectional views illustrating a method for manufacturing the semiconductor device 1 according to a third embodiment. In the third embodiment, the material for the resin layer 20 is supplied twice separately. For example, as shown in FIG. 3, the material for the resin layer 20 is supplied onto the front surface of the wiring substrate 10.

Figure 12:
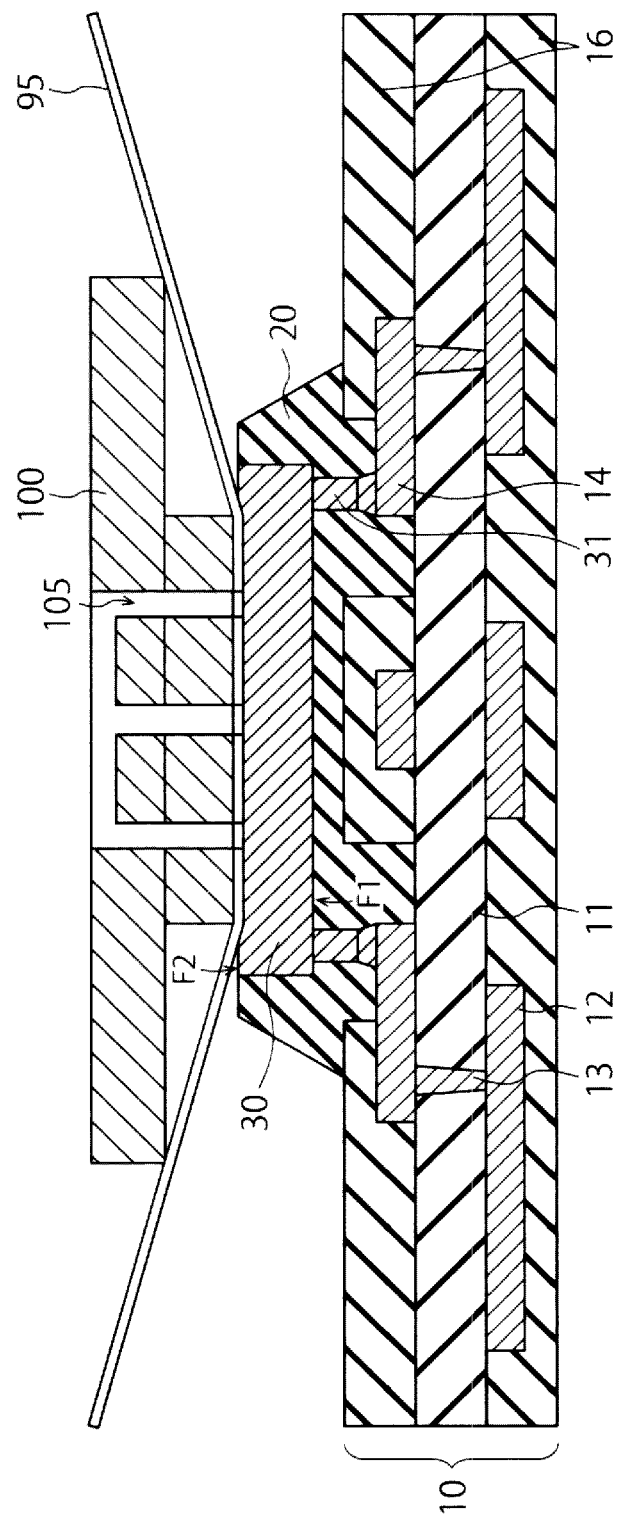
FIG. 12 is a cross-sectional view illustrating a step of a semiconductor device manufacturing process according to a third embodiment.
Figure 13:
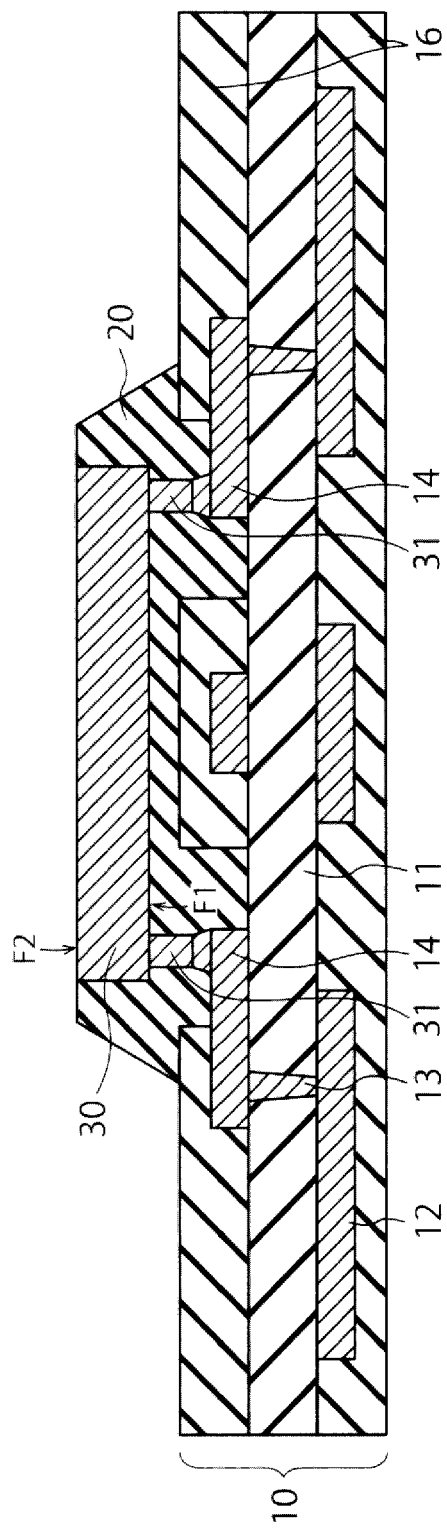
FIG. 13 is a cross-sectional view illustrating a step, following the step of FIG. 12, of the semiconductor device manufacturing process.

Next, as shown in FIG. 12, the pressure bonding apparatus 100 attracts and holds the controller chip 30 via the FAB film 95, and places the controller chip 30 on the wiring substrate 10. The pressure bonding apparatus 100 stacks the controller chip 30 on the wiring substrate 10 in such a manner that the electrodes 31, provided on the first surface F1 of the controller chip 30, meet the metal pads 14 of the wiring substrate 10. The pressure bonding apparatus 100 heats the wiring substrate 10 and the controller chip 30 while applying a pressure to them, thereby flip-chip connecting the electrodes 31 of the controller chip 30 to the metal pads 14 of the wiring substrate 10. In the third embodiment, the pressure bonding apparatus 100 has not yet formed the gap G between the FAB film 95 and the controller chip 30 at this stage, and therefore the resin layer 20 has not yet covered the second surface F2 of the controller chip 30. Thus, the structure shown in FIG. 13 is obtained.

Figure 14:
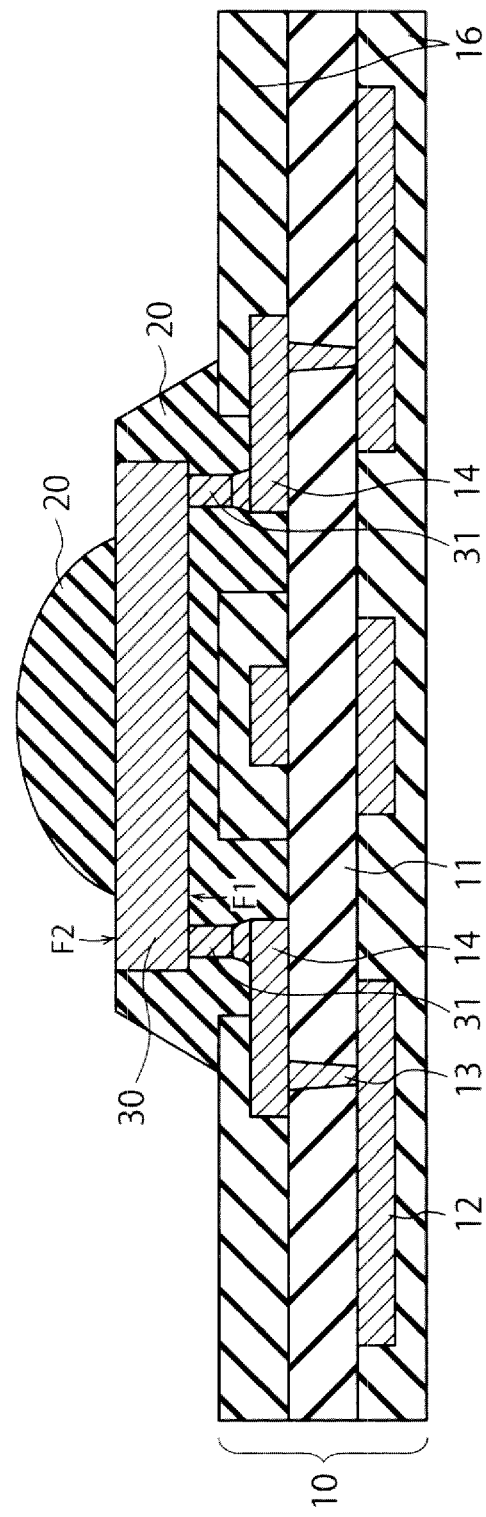
FIG. 14 is a cross-sectional view illustrating a step, following the step of FIG. 13, of the semiconductor device manufacturing process.

Next, as shown in FIG. 14, the material for the resin layer 20 is supplied again to the second surface F2 of the controller chip 30.

Figure 15:
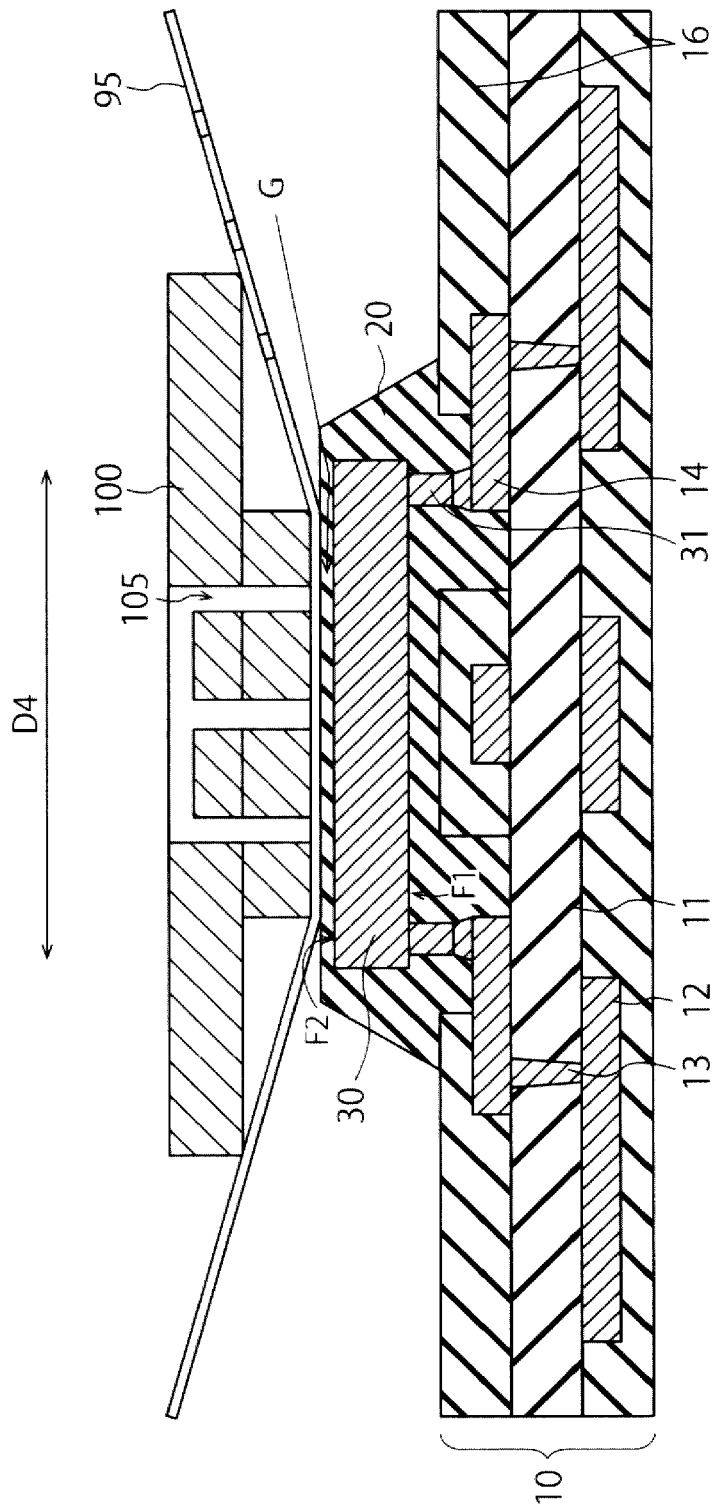
FIG. 15 is a cross-sectional view illustrating a step, following the step of FIG. 14, of the semiconductor device manufacturing process.

Next, as shown in FIG. 15, the pressure bonding apparatus 100 substantially flattens with the FAB film 95 the material for the resin layer 20 on the second surface F2 of the controller chip 30. The holes of the FAB film 95 have been displaced from the positions corresponding to the suction holes 105 of the pressure bonding apparatus 100. Upon the flattening of the resin layer 20, the pressure bonding apparatus 10 forms the gap G between the FAB film 95 and the second surface F2 of the controller chip 30, and reciprocates in the D4 direction, so that the material for the resin layer 20 is introduced into the gap G and the upper surface of the resin layer 20 is substantially flattened. The resin layer 20 is then cured e.g. by heating the material for the resin layer 20.

Thus, in the third embodiment, after the first supply of the material for the resin layer 20, the pressure bonding apparatus 100 applies a pressure to the controller chip 30 to flip-chip connect the controller chip 30 to the wiring substrate 10. After the subsequent second supply of the material for the resin layer 20, the pressure bonding apparatus 100 moves again onto the controller chip 30, and levels the material for the resin layer 20 so that the resin layer 20 substantially flatly covers the second surface F2 of the controller chip 30.

Next, the subsequent process steps described above with reference to the first embodiment are followed to complete the semiconductor device 1 shown in FIG. 1. Thus, the semiconductor device 1 can also be manufactured by supplying the material for the resin layer 20 twice separately.

Fourth Embodiment

FIGS. 16 through 19 are cross-sectional views illustrating a method for manufacturing the semiconductor device 1 according to a fourth embodiment. The fourth embodiment is the same as the third embodiment in that the material for the resin layer 20 is supplied twice separately. On the other hand, as with the pressure bonding apparatus 100 of the second embodiment, the area of the attracting surface of the pressure bonding apparatus 100 of the fourth embodiment is larger than the area of the second surface F2 of the controller chip 30. Thus, the fourth embodiment is a combination of the second embodiment and the third embodiment.

Figure 16:
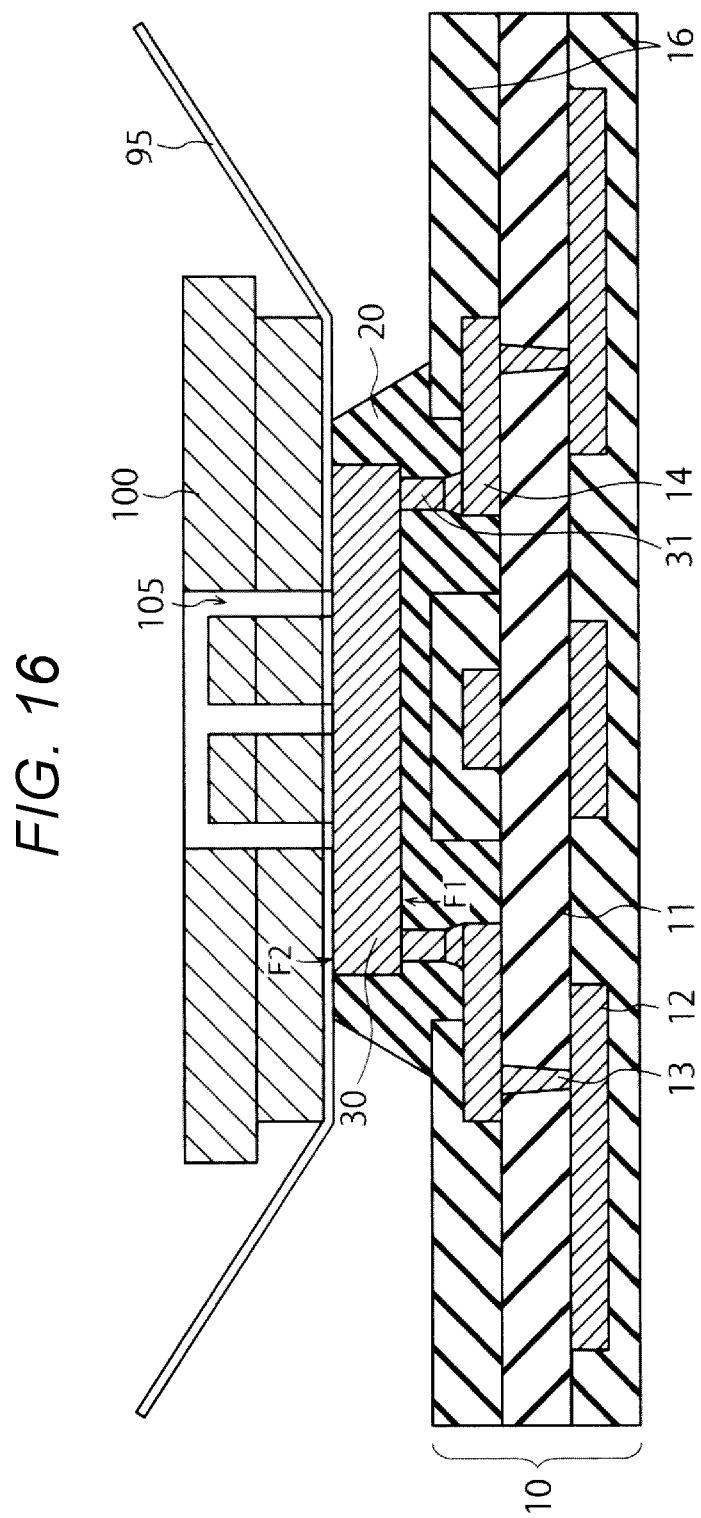
FIG. 16 is a cross-sectional view illustrating a step of an exemplary semiconductor device manufacturing process according to a fourth embodiment.

For example, as shown in FIG. 3, the material for the resin layer 20 is supplied to the front surface of the wiring substrate 10. Next, as shown in FIG. 16, the pressure bonding apparatus 100 attracts and holds the controller chip 30 via the FAB film 95, and places the controller chip 30 on the wiring substrate 10. The pressure bonding apparatus 100 stacks the controller chip 30 on the wiring substrate 10 in such a manner that the electrodes 31, provided on the first surface F1 of the controller chip 30, meet the metal pads 14 of the wiring substrate 10. The pressure bonding apparatus 100 heats the wiring substrate 10 and the controller chip 30 while applying a pressure to them, thereby flip-chip connecting the electrodes 31 of the controller chip 30 to the metal pads 14 of the wiring substrate 10. In the fourth embodiment, the pressure bonding apparatus 100 has not yet formed the gap G between the FAB film 95 and the controller chip 30 at this stage, and therefore the resin layer 20 has not yet covered the second surface F2 of the controller chip 30. Thus, the structure shown in FIG. 17 is obtained.

Next, as shown in FIG. 18, the material for the resin layer 20 is supplied again to the second surface F2 of the controller chip 30.

Next, as shown in FIG. 19, the pressure bonding apparatus 100 substantially flattens with the FAB film 95 the material for the resin layer 20 on the second surface F2 of the controller chip 30. The holes of the FAB film 95 have been displaced from the positions corresponding to the suction holes 105 of the pressure bonding apparatus 100. Since the area of the attracting surface of the pressure bonding apparatus 100 of the fourth embodiment is larger than the area of the second surface F2 of the controller chip 30, there is no need to reciprocate the pressure bonding apparatus 100 in the D4 direction upon the flattening of the resin layer 20. The material for the resin layer 20 is introduced into the gap G between the FAB film 95 and the second surface F2 of the controller chip 30, and the upper surface of the resin layer 20 is substantially flattened. The resin layer 20 is then cured e.g. by heating the material for the resin layer 20.

Next, the subsequent process steps described above with reference to the first embodiment are followed to complete the semiconductor device 1 shown in FIG. 1. The semiconductor device 1 can also be manufactured by thus combining the second embodiment with the third embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first substrate;
   a first semiconductor chip having a first surface facing the first substrate and a second surface opposite the first surface, the first semiconductor chip having electrodes on the first surface and being coupled to the first substrate;
   a first resin layer that is provided at least between the first substrate and the first semiconductor chip, and covers the second surface, wherein the first resin layer has an upper surface substantially flatter than the second surface;
   a second semiconductor chip; and
   an adhesive layer provided between the first resin layer and the second semiconductor chip.

2. The semiconductor device according to claim 1, further comprising a spacer provided adjacent to the first semiconductor chip, a top surface of the spacer being located on approximately the same level as an upper surface of the first resin layer, wherein the second semiconductor chip is bonded to the first resin layer and the spacer via the adhesive layer.

3. The semiconductor device according to claim 1, wherein a thickness of the first resin layer is greater than or equal to a vertical extent by which the first semiconductor chip is warped.

4. The semiconductor device according to claim 1, wherein the first resin layer includes a material selected from at least one of: an epoxy resin, an acrylic resin, or silica.

5. The semiconductor device according to claim 1, wherein the first semiconductor chip is connected to the first substrate via the electrodes of the first semiconductor chip and at least one metal pad of the first substrate.

6. The semiconductor device according to claim 2, further comprising;
   a second resin covering the spacer, the first semiconductor chip and the second semiconductor chip.

7. The semiconductor device according to claim 1, further comprising;
   a first wire connecting a second semiconductor chip to the first substrate.

8. The semiconductor device according to claim 1, wherein the upper face of the first resin layer is wider than an upper face of the semiconductor chip.

* * * * *